United States Patent [19]

Osawa

[11] Patent Number: 5,608,667
[45] Date of Patent: Mar. 4, 1997

[54] FERROELECTRIC MEMORY AUTOMATICALLY GENERATING BIASING PULSE FOR PLATE ELECTRODE

[75] Inventor: Toshimasa Osawa, Kanagawa, Japan

[73] Assignee: Sony Corporation, Japan

[21] Appl. No.: 614,727

[22] Filed: Mar. 13, 1996

[30] Foreign Application Priority Data

Mar. 27, 1995 [JP] Japan ................................ 7-068339
Nov. 27, 1995 [JP] Japan ................................ 7-307567

[51] Int. Cl.$^6$ ........................................ G11C 11/22
[52] U.S. Cl. ................................ 365/145; 365/149
[58] Field of Search ................................ 365/145, 149, 365/65

[56] References Cited

U.S. PATENT DOCUMENTS 5,414,654 5/1995 Kubota et al. ........................ 365/145
5,432,731 7/1995 Kirsch et al. ........................ 365/145

Primary Examiner—David C. Nelms
Assistant Examiner—F. Niranjan
Attorney, Agent, or Firm—Ronald P. Kananen

[57] ABSTRACT

A semiconductor memory using cells with a ferroelectric capacitor having one plate connected to a bit line by a MISFET and another plate connected to a plate line. A plate line control signal is applied to a plate line of a selected row by a pulse generator. The pulse generator generates the plate line selecting signal with a predetermined pulse width after enabling a word line.

7 Claims, 5 Drawing Sheets

FERROELECTRIC MEMORY AUTOMATICALLY GENERATING BIASING PULSE FOR PLATE ELECTRODE

BACKGROUND OF THE INVENTION

1. Field of the Invention

The present invention relates to a ferroelectric memory for writing and reading data utilizing the direction of polarization of a ferroelectric.

2. Description of the Related Art

Two types of ferroelectric nonvolatile memory utilizing the reversal of polarization of a ferroelectric having a hysteresis characteristic have been proposed: a one-transistor-one-capacitor (1Tr-1Cap) type wherein one bit is constituted by one switching transistor and one ferroelectric capacitor and a two-transistor-two-capacitor (2Tr-2Cap) type wherein one bit is constituted by two switching transistors and two ferroelectric capacitors.

In the above-mentioned 1Tr-1Cap type or 2Tr-2Cap type ferroelectric memory, a first electrode of each of the ferroelectric capacitors is connected to a bit line through the switching transistor and a second electrode of each of the ferroelectric capacitors is connected to a plate line. The data read and write operations are performed by supplying a first drive signal having a predetermined level to a gate electrode of the switching transistor through a word line and a second drive signal having a predetermined level to the second electrode of the ferroelectric capacitor through the plate line at a predetermined timing.

In the above-described ferroelectric memory, in the data read or the data write operation, the timing of application of a first drive signal for the gate electrode of the switching transistor and the timing of application of a second drive signal for the second electrode of the ferroelectric capacitor are controlled separately.

To achieve an increase in speed, it is necessary to reduce the pulse width. The faster the speed, the more necessary it is to reduce the pulse width.

However, in the above-described ferroelectric memory, since the timings of application are controlled separately, it is difficult to adjust the timings and there is a limitation in the increase of speed.

Also, there is the possibility that the timing of application of the first drive signal for the word line may become earlier or later than a predetermined timing and may therefore become a primary factor of an operational error.

SUMMARY OF THE INVENTION

An object of the present invention is to provide an improved ferroelectric memory which overcomes these disadvantages of the related art.

According to the present invention, there is provided a ferroelectric memory which has a plurality of memory cells arranged in rows and columns, each column comprising a bit line connected to memory cells along the column, each the memory cells comprising a ferroelectric capacitor having first and second plate electrodes, the polarization of the capacitors corresponding to the data stored therewithin, wherein the memory further comprises a plurality of word lines and a plurality of plate lines distinct from the bit lines and word lines, each of the memory cells along a row being connected to a word line corresponding to the row, each memory cell being also connected to a corresponding plate line, each plate line being connected to plate electrodes in a plurality of the cells, each of the memory cells further including a switching device, the first plate electrode of the capacitor in the cell being connected to its corresponding bit line through the switching device, the switching device being connected to be controlled by the corresponding word line, the second plate electrode of the capacitor in the cell being connected to the corresponding plate line, further comprising a pulse generator between each word line and each plate line of each row, each pulse generator controlled by each word line.

Preferably, the switching devices comprises a field effect transistor having a gate electrode coupled to be controlled by the word line.

Preferably, each plate line is parallel to said each word line.

Further preferably, the pulse generator generates a pulse having a predetermined pulse width for driving the each plate line of each row after enabling each word line.

Preferably, the pulse generator receives a signal supplied to the word line and generates a pulse signal having a predetermined width, and supplies it to the plate line.

There is provided, a ferroelectric memory which has at least one memory cell comprised of a ferroelectric capacitor, having first and second electrodes and a ferroelectric arranged between the electrodes and storing data by utilizing the direction of polarization of the ferroelectric determined by the voltages supplied to the electrodes, and a switching transistor, connecting between a bit line and the first electrode of the ferroelectric capacitor operatively according to a level of a first drive signal supplied to a word line, and which stores or reads data by supplying a second drive signal having a level according to the level of the first drive signal when the switching transistor is in a conductive state to the second electrode of the ferroelectric capacitor, comprising;

a pulse generator receiving the first drive signal of the word line and generating a pulse signal having a predetermined width, and supplying it to the second electrode of the ferroelectric capacitor as the second drive signal.

Preferably, the pulse generator generates the pulse signal having a predetermined width when it detects a level switching of the first drive signal to a level making the switching transistor in a conductive state.

According to the ferroelectric memory of the present invention, in a read or write operation, a first drive signal having a predetermined level is applied to the word line. Due to this, the switching device switches from a non-conductive state to a conductive state.

Also, the first drive signal applied to the word line is input to a pulse generator.

In the pulse generator, for example, when a level of the first drive signal switches to a level to make the switching device switch the conductive state and the level switching of the first drive signal is detected, a pulse signal having a predetermined width is generated and the pulse signal is applied to the second electrode of the ferroelectric capacitor as a second drive signal.

BRIEF DESCRIPTION OF THE DRAWINGS

These and other objects and features of the present invention will become more apparent from the following description of the preferred embodiments made with reference to the attached drawings, in which.

DESCRIPTION OF THE PREFERRED EMBODIMENTS

Before describing the preferred embodiments, the related art will be explained in further detail with reference to the drawings for facilitating the understanding of the preferred embodiment.

Figure 1:
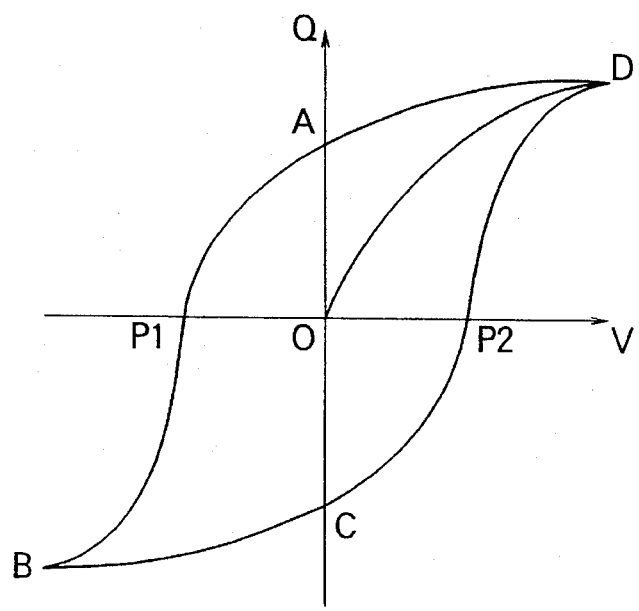
FIG. 1 is a view showing the hysteresis of the polarization characteristic of a ferroelectric.

Two types of ferroelectric nonvolatile memory utilizing the reversal of polarization of a ferroelectric having a hysteresis characteristic shown in Fig. 1 have been proposed: a 1Tr-1Cap type wherein one bit is constituted by one switching transistor and one ferroelectric capacitor and 2Tr-2Cap type wherein one bit is constituted by two switching transistors and two ferroelectric capacitors.

Figure 2:
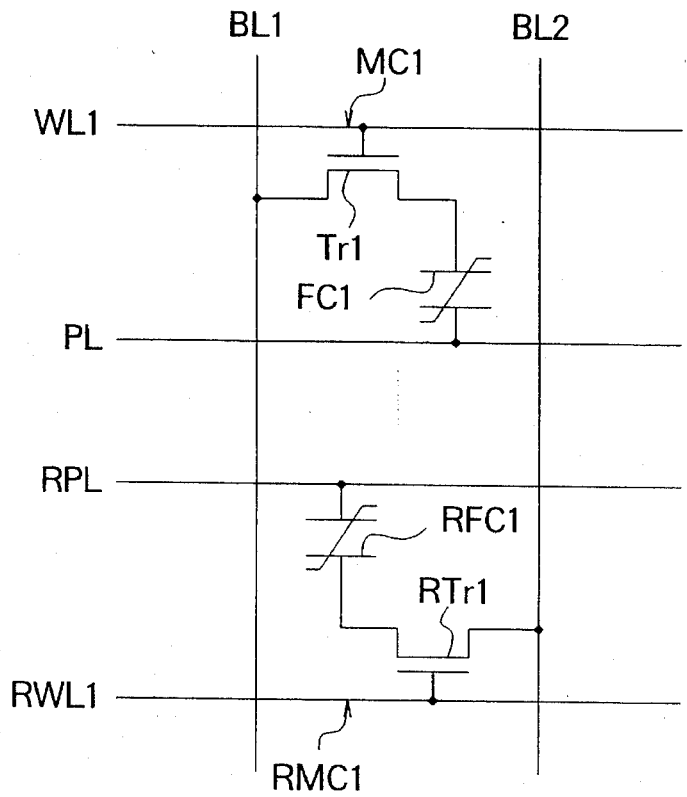
FIG. 2 is a view of the constitution of a memory array of a 1Tr-1Cap type ferroelectric nonvolatile memory.

FIG. 2 is a view of the constitution of a memory array of a 1Tr-1Cap type ferroelectric nonvolatile memory.

As shown in FIG. 2, a memory cell MC1 is configured as a switching transistor Tr1 comprised of an n-channel (N) metal oxide semiconductor (MOS) transistor wherein a drain electrode is connected to a bit line BL1 and a ferroelectric capacitor FC1 wherein one (first) electrode is connected to a source electrode of the switching transistor Tr1. One bit is constituted by the switching transistor Tr1 and the ferroelectric capacitor FC1. A gate electrode of the switching transistor Tr1 is connected to a word line WL1, and other (second) electrode (plate electrode) of the ferroelectric capacitor FC1 is connected to a plate line PL.

The 1Tr-1Cap type nonvolatile memory is further provided with a reference cell RMC1. The reference cell RMC1 is configured as a switching transistor RTr1 for reference wherein a drain electrode is connected to a bit line BL2 paired with the bit line BL1 and a ferroelectric capacitor RFC1 for reference wherein one electrode is connected to a source electrode of the switching transistor RTr1. A gate electrode of the switching transistor is connected to a word line RWL1 for reference, and other electrode of the ferroelectric capacitor RFC1 is connected to a plate line RPL for reference.

Note that when the number of times of changing the direction of polarization of the ferroelectric increases, fatigue of the ferroelectric occurs and the quantity of the charge generated in the electrodes decreases. Accordingly, the reference cell RCM1 is controlled by constantly writing data "0" in order to prevent the occurrence of fatigue.

Next, an explanation will be made of a read operation of a 1Tr-1Cap type nonvolatile memory by referring to the timing chart of FIG. 3.

First, 0 V is applied to the bit lines BL1, BL2 by a not illustrated column control circuit. After this, the bit lines BL1, BL2 are made open.

Vcc+$\alpha$ V (for example, $\alpha$=1) is applied to the word line WL1 by a not illustrated row decoder serving as a row control circuit. Due to this, the switching transistor Tr1 switches from a non-conductive state to a conductive state.

Similarly, Vcc+1 V is applied to the word line RWL1 for reference. Due to this, the switching transistor RTr1 switches from the non-conductive state to the conductive state.

Note that, the reason for applying a voltage higher than Vcc by 1 V is that the threshold voltage Vth of the switching transistor is less than 1 V, so it is necessary to prevent a voltage drop due to the transistor.

Figure 3:
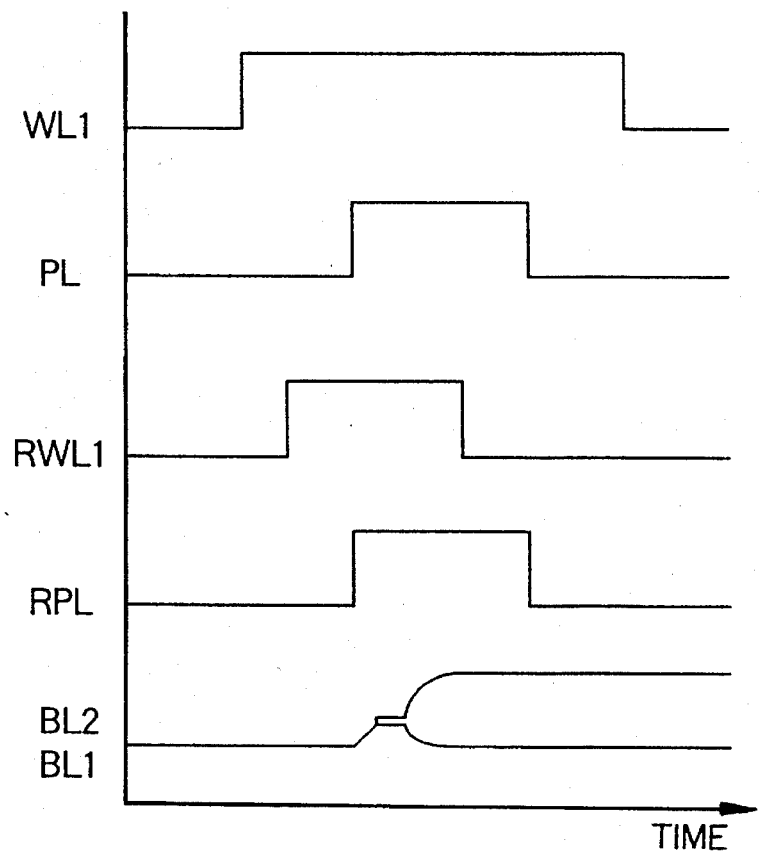
FIG. 3 is a timing chart showing the timing of a read operation of a 1Tr-1Cap type ferroelectric nonvolatile memory in FIG. 2.

Subsequently, the power supply voltage Vcc is applied to the plate lines PL and RPL at about the same rising timing of the word lines WL1, RWL1 or after a predetermined timing as shown in FIG. 3.

Due to this, the potential of the bit line BL1 changes according to the state of polarization of the ferroelectric capacitor FC1, and the potential of the bit line BL2 changes according to the state of polarization of the ferroelectric capacitor RFC1.

The difference between the potential of the bit line BL2 connected to the reference cell RMC1 and the potential of the bit line BL1 connected to the memory cell MC1 according to the states of polarization of the ferroelectric capacitors RFC1, FC1 is detected by a not illustrated sense amplifier.

Note that, the reference cell RMC1 is used without making the ferroelectric reverse in direction of polarization, so the potential of the word line RWL1 is set to fall to 0 V at a timing earlier than the timing of falling of the plate line PL for reference in order to prevent entering a re-write operation, namely, to write the "0" data. Note that, after the switching transistor RTr1 switches from the conductive to the non-conductive state, the potential of the plate line RPL for reference is reduced to 0 V.

In a usual memory cell 1, after a data read operation is carried out, for carrying out the above-described re-write operation, the potential of the plate line PL is made to fall to 0 V at about the same timing as the plate line RPL for reference and the potential of the word line WL1 is made to fall from Vcc+1 V to 0 V.

Due to this, the switching transistor Tr1 switches from the conductive state to the non-conductive state, and the read operation is terminated.

Figure 4:
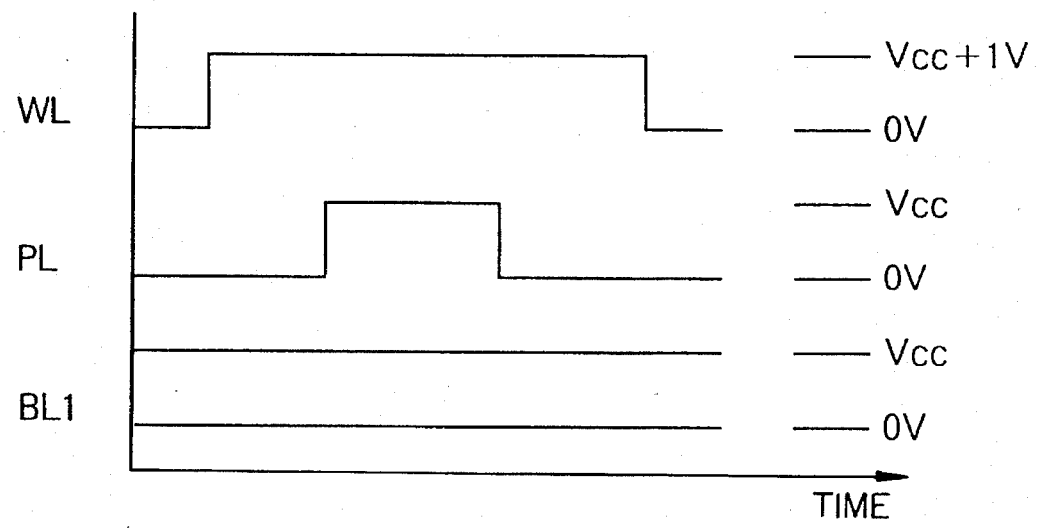
FIG. 4 is a timing chart showing the timing of a write operation of a 1Tr-1Cap type ferroelectric nonvolatile memory.

FIG. 4 is a timing chart showing the timing of a write operation of the 1Tr-1Cap type nonvolatile memory.

In a data write operation, the potentials of the word line WL and the plate line are controlled as shown in FIG. 4. Due to this, the polarization of one ferroelectric capacitor is made to shift to a C point (state 0) or A point (state 1) on the hysteresis curve in FIG. 1.

Note that in the above-described circuit of FIG. 2, in the data read or the data write operation, the timing of application of a first drive pulse signal for the word lines WL, RWL and the timing of application of a second drive pulse signal for the plate lines PL, RPL are controlled separately.

To increase the speed, it is necessary to reduce the pulse width. The more the speed is increased, the more it is necessary to reduce the pulse width. However, in the above described circuit, since the timings of application are controlled separately, it is difficult to adjust the timings and there is a limitation in the increase of speed.

Also, there is the possibility that the applied timing of the first drive pulse signal for the word lines WL, RWL may become earlier or later than a predetermined timing and may become a primary factor of an operational error.

A preferred embodiment of the present invention will be explained in detail next.

Figure 5:
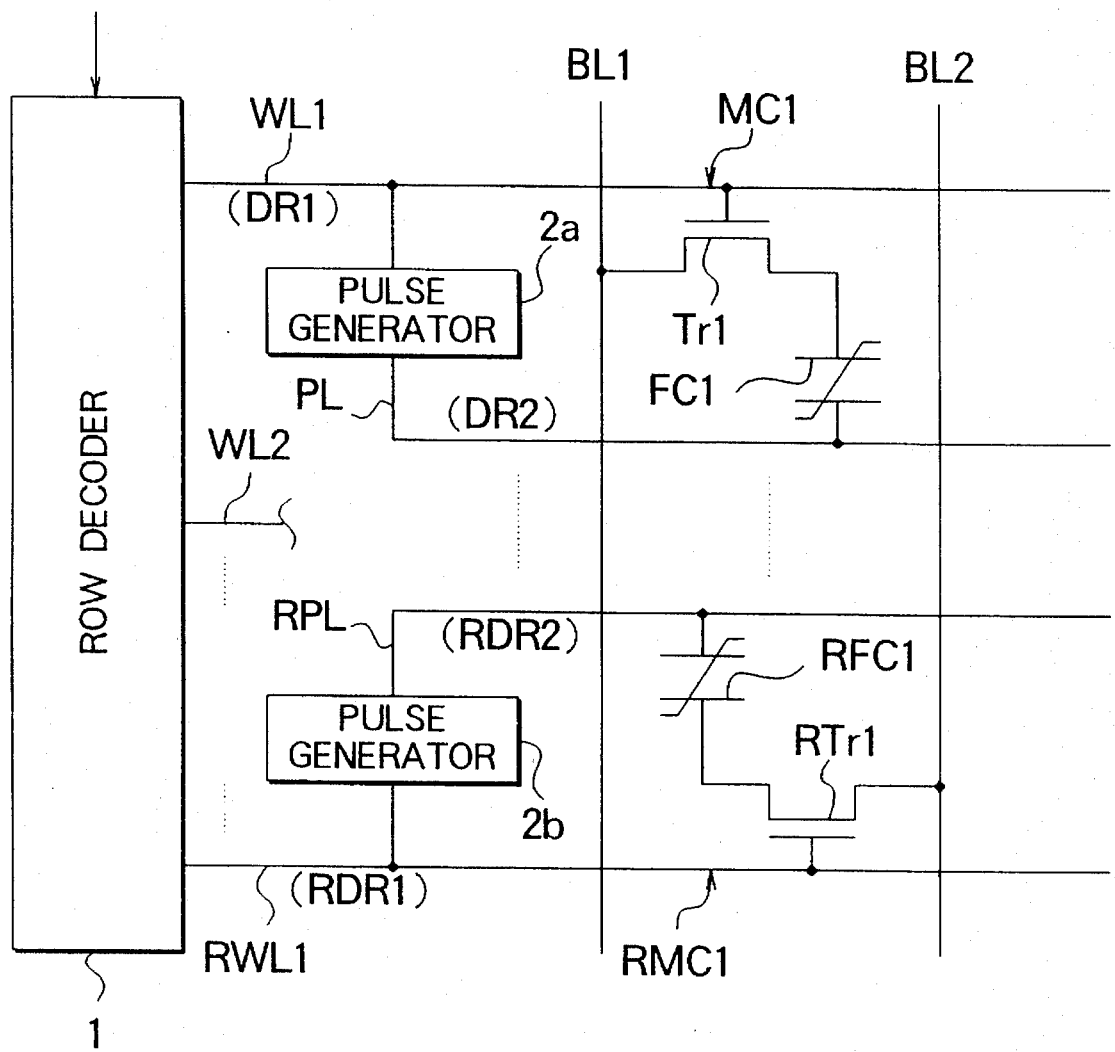
FIG. 5 is a circuit diagram of a basic one-bit constitution of a 1Tr-1Cap type ferroelectric nonvolatile memory according to the present invention.

FIG. 5 is a circuit diagram of a basic one-bit constitution of a 1Tr-1Cap type ferroelectric nonvolatile memory according to the present invention.

In FIG. 5, MC1 represents a memory cell, RMC1 represents a reference cell, BL1 and BL2 represent bit lines, WL1 and WL2 represent word lines, PL represents a plate line, RWL1 represents a word line for reference, RPL represents a plate line for reference, 1 represents a row decoder, and 2a and 2b represent pulse generators.

The pulse generator 2a is utilized for usual memory cells, and the pulse generator 2b is utilized for reference cells. These pulse generators 2a, 2b are provided for each of the word lines WL, RWL (each row). A plate line PL is connected to the pulse generator 2a, and a plate line RPL is connected to the pulse generator 2b.

Note that, in this circuit, a column decoder and a sense amplifier, which are connected to the bit lines BL1 and BL2, are omitted for simplifying the drawing.

The pulse generator 2a receives a drive signal DR1 supplied to the word line WL1 by the row decoder 1, detects a level switching of the drive signal DR1 from a low level (0 V) to a high level (Vcc+1 V), and after a predetermined delay time from the level switching time, generates a drive pulse signal DR2, which has the power supply voltage Vcc level and a predetermined width, and outputs it to the plate line PL.

Similarly, the pulse generator 2b receives a drive signal RDR1, detects a level switching of the drive signal RDR1 from the low level (0 V) to the high level (Vcc+1 V), and after a predetermined delay time from the level switching time, generates a drive pulse signal RDR2, which has the power supply voltage Vcc level and a predetermined width, and outputs it to the plate line RPL for reference.

Figure 6:
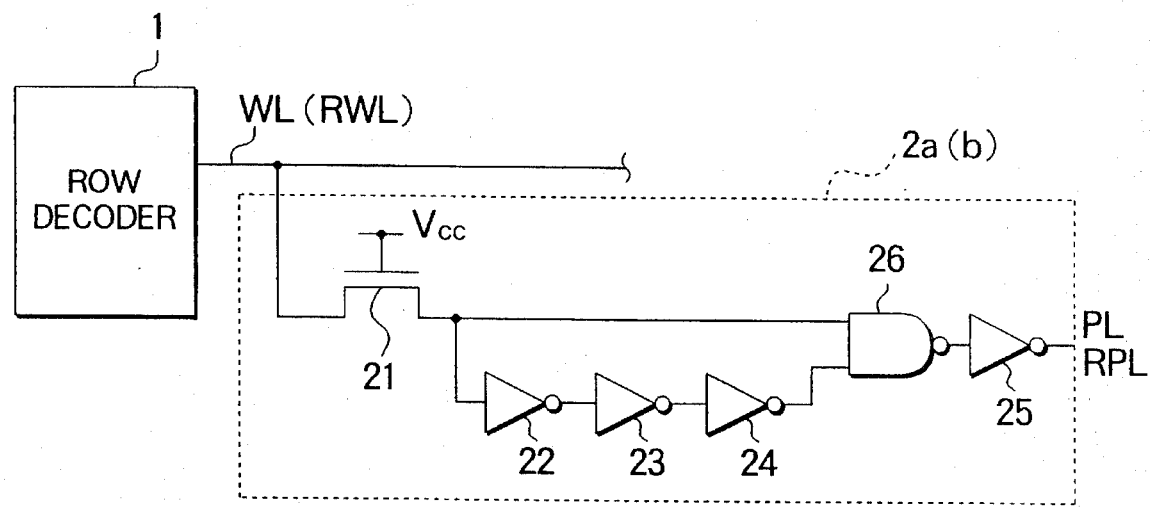
FIG. 6 is a circuit diagram of one embodiment of a pulse generator in FIG. 5.

These pulse generators 2a, 2b have same constitutions and, for example, are constituted as shown in FIG. 6.

As shown in FIG. 6, the pulse generator 2a (b) is configured by an NMOS transistor 21, inverters 21 to 25, and a two-input NAND gate 26.

In the input stage of the pulse generator 2a, the NMOS transistor 21, which has a gate electrode connected to the supply line of the power supply voltage Vcc, is provided at the connecting stage for the word line WL (RWL). The inverters 22 to 24 are connected in series. An input of the inverter 22 and one input of the NAND gate 26 are connected to the NMOS transistor 21, an output of the inverter 24 is connected to other input of the NAND gate 26, an output of the NAND gate 26 is connected to an input of the inverter 25, and an output of the inverter 25 is connected to the plate line PL (RPL).

The pulse generator 2a (b) having the above-mentioned constitution is made to fall to the level of the power supply voltage Vcc by passing the level of the drive signal DR1 (RDR1) charged up to Vcc+1 V through the NMOS transistor 21 with a gate electrode connected to the supply line of the power supply voltage Vcc.

The pulse generator 2a (b) generates the drive pulse signal DR2 (RDR2) having a predetermined pulse width T1 according to the difference of transfer of signals due to the three inverters 22 to 24 in the latter part of the generator and the like.

The pulse width T1 is adjusted by the delay rate of the three inverters 22 to 24. When only the drive signal DR1 (RDR1) for the word line rises from 0 V to Vcc+1 V, the drive pulse signal DR2 (RDR2) is generated.

Figure 7:
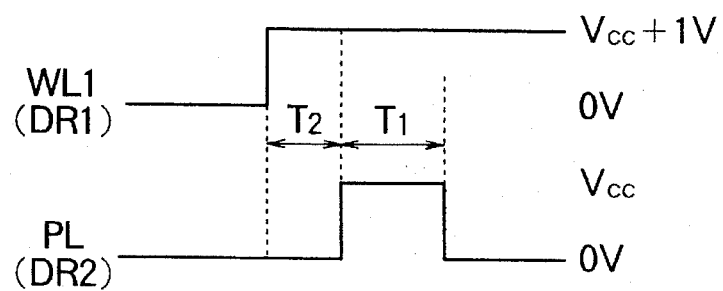
FIG. 7 is a timing chart showing the timing of an operation of a pulse generator in FIG. 6.

FIG. 7 is a timing chart showing the relationship between the drive signal DR1 for the word line WL and the drive pulse signal DR2 for the plate line PL generated by the pulse generator 2a.

As mentioned above, the pulse width T1 is adjusted by the delay rate of the three inverters 22 to 24. The delay time T2 from the rising time of the drive signal DR1 to the falling time of the drive pulse signal DR2 is decided by the delay of the latter part of the NMOS transistor 21.

Figure 8:
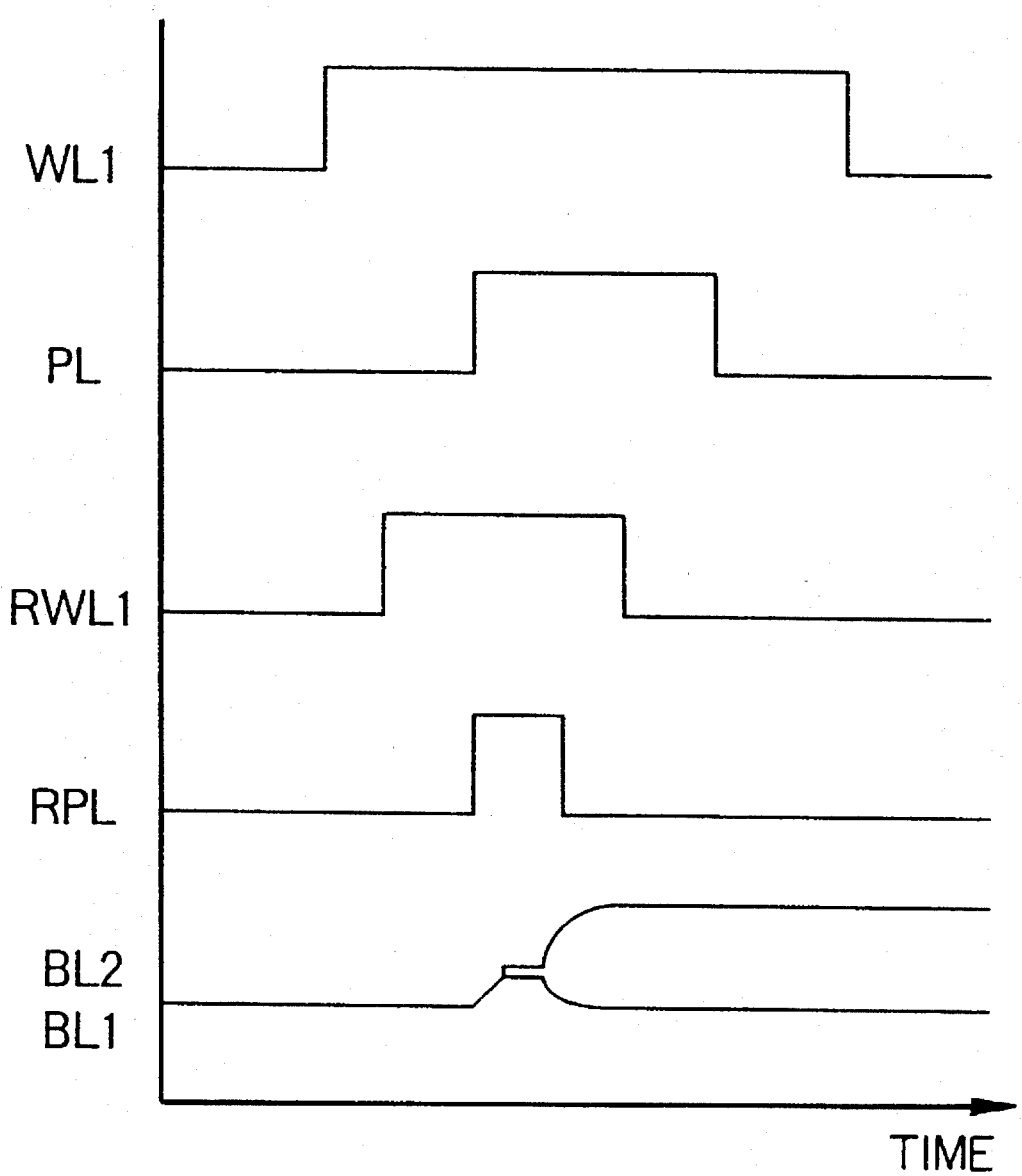
FIG. 8 is a timing chart showing the timing of a read operation of a ferroelectric nonvolatile memory in FIG. 5.

Next, an explanation will be made of a read operation of the above-mentioned structure with reference to the timing chart of FIG. 8.

First, the drive signal DR1 charged up to Vcc+1 V by a not illustrated charge pump circuit is supplied to the word line WL1 selected according to an address signal output from a not illustrated control circuit. Due to this, the switching transistor Tr1 of the memory cell MC1 switches from the non-conductive state to the conductive state.

Also, the drive signal DR1 of the Vcc+1 V level supplied to the word line WL1 is input to the pulse generator 2a.

In the pulse generator 2a, the pulse width T1 is adjusted by the delay rate of the three inverters 22 to 24 at the rising timing of the drive signal DR1 and that level is made to pass through the NMOS transistor 21 with the gate electrode connected to the supply line of the power supply voltage Vcc, whereby the level falls to the power supply voltage Vcc and the adjusted drive pulse signal DR is generated and output to the plate line PL.

Due to this, the power supply voltage Vcc is supplied to the plate electrode of the ferroelectric capacitor FC1 of the memory cell MC1 for exactly a predetermined period.

Similarly, the voltage Vcc+1 V is applied to the word line RWL1 for reference. Due to this, the switching transistor RTr1 for reference switches from the nonconductive state to the conductive state.

Also, the drive signal RDR1 of the Vcc+1 V level supplied to the word line RWL is input to the pulse generator 2b.

In the pulse generator 2b, the pulse width T1 is adjusted by the delay rate of the three inverters 22 to 24 at the rising timing of the drive signal RDR1 and that level is made to pass through the NMOS transistor 21 with the gate electrode connected to the supply line of the power supply voltage Vcc, whereby the level falls to the power supply voltage Vcc and the adjusted drive pulse signal RDR2 is generated and output to the plate line RPL.

Due to this, the power supply voltage Vcc is applied to the plate electrode of the ferroelectric capacitor RFC1 of the reference cell RMC1 for exactly the predetermined period.

As a result, the potential of the bit line BL1 changes according to the state of polarization of the ferroelectric capacitor FC1, and the potential of the bit line BL2 changes according to the state of polarization of the ferroelectric capacitor RFC2.

The difference between the potential of the bit line BL2 connected to the reference cell RMC1 and the potential of the bit line BL1 connected to the memory cell MC1 caused by the states of polarization of the ferroelectric capacitors RFC1, FC1 is detected by a not illustrated sense amplifier.

Note that, in the reference cell RMC1, the potential of the word line RWL1 is set to fall to 0 V at a timing later than the falling time of the plate line RPL for reference. Note that, after the potential of the plate line RPL for reference is made to fall to 0 V, the potential of the word line RWL1 for reference is made to fall to 0 V. Due to this, the switching transistor RTr1 switches from the conductive state to the non-conductive state.

In a usual memory cell MC1, after a data read operation is carried out, for carrying out the above-described re-write operation, the potential of the plate line PL is made to fall to 0 V, and the potential of the word line WL1 is made to fall from Vcc+1 V to 0 V.

Due to this, the Switching transistor Tr1 switches from the conductive state to the non-conductive state, and the read operation is terminated.

As explained above, according to the present embodiment, provision is made of pulse generators 2a, 2b, which receive drive signals DR1, RDR1 supplied to the word lines WL1, RWL1 by a row decoder 1 and detect level switchings of the drive signals DR1, RDR1 from a low level (0 V) to a high level ([Vcc+1 V]) and, after a predetermined delay time from the level switching time, generate drive pulse signals DR2, RDR2, which have the power supply voltage Vcc level and a predetermined width, and output them to the plate lines PL, RPL, so it is possible to design the timing of the memory and realize an enhancement of speed.

In addition, it is possible to prevent a signal delay at the read and write operation, prevent the occurrence of erroneous operation, and realize precise operation.

Note that while the present embodiment was explained with reference to a 1Tr-1Cap type ferroelectric nonvolatile memory as an example, needless to say the present invention may also be applied to a 2Tr-2Cap type ferroelectric nonvolatile memory.

Many widely different embodiments of the present invention may be constructed without departing from the scope of the invention. It is understood that the present invention is not restricted to the specific embodiments described above.

What is claimed is:

1. A ferroelectric memory which has a plurality of memory cells arranged in rows and columns, each column comprising a bit line connected to said memory cells along the column, each said memory cell comprising a ferroelectric capacitor having first and second electrodes, the polarization of said capacitors indicating to the status of data stored therewithin, the improvement wherein:

said memory further comprises a plurality of word lines and a plurality of plate lines distinct from said bit lines and word lines, each of the memory cells provided along a row being connected to a word line corresponding to the row, each memory cell being also connected to a corresponding plate line, each plate line being connected to plate electrodes in a plurality of said memory cells, each said memory cell further including a respective switching device, said first electrode of said capacitor in said memory cell being connected to its corresponding bit line through said switching device, said switching device being connected to be controlled by said corresponding word line, said second electrode of said capacitor in said cell being connected to said corresponding plate line, said memory further comprising a plurality of pulse generators, each provided between each word line and each plate line of each row, said each pulse generator controlled by said each word line.

2. A memory according to claim 1, wherein each of said switching devices comprises field effect transistors having gate electrodes connected to be controlled by said word line.

3. A memory according to claim 1, wherein said each plate line formed parallel to said each word line.

4. A memory according to claim 1, each of said pulse generator generating a pulse having a predetermined pulse width for driving said each plate line of each row after enabling of said each word line.

5. A memory according to claim 1, wherein said pulse generator receives a signal supplied to said word line and generates a pulse signal having a predetermined width, and supplies it to said plate line.

6. A ferroelectric memory which has at least one memory cell comprised of a ferroelectric capacitor, having first and second electrodes and a ferroelectric arranged between said electrodes and storing data by utilizing the direction of polarization of said ferroelectric determined by the voltages supplied to said electrodes, and a switching transistor, connecting between a bit line and said first electrode of said ferroelectric capacitor operatively according to a level of a first drive signal supplied to a word line, and which stores or reads data by supplying a second drive signal having a level according to the level of said first drive signal when said switching transistor is in a conductive state to said second electrode of said ferroelectric capacitor, comprising;

a pulse generator receiving said first drive signal of said word line and generating a pulse signal having a predetermined width, and supplying it to said second electrode of said ferroelectric capacitor as said second drive signal.

7. A memory according to claim 6, wherein said pulse generator generates said pulse signal having a predetermined width when it detects a level switching of said first drive signal to a level making said switching transistor in a conductive state.

\* \* \* \* \*